United States Patent
Luan et al.

(10) Patent No.: US 10,909,900 B2
(45) Date of Patent: Feb. 2, 2021

(54) DISPLAY SUBSTRATE, DISPLAY DEVICE AND DISPLAY CONTROL METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Mengyu Luan, Beijing (CN); Zhongsheng Qi, Beijing (CN); Bo Mao, Beijing (CN); Youyuan Hu, Beijing (CN); Lang Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/430,001

(22) Filed: Jun. 3, 2019

(65) Prior Publication Data
US 2020/0168144 A1 May 28, 2020

(30) Foreign Application Priority Data
Nov. 22, 2018 (CN) .......................... 2018 1 1399401

(51) Int. Cl.
*G09G 3/20* (2006.01)
*H01L 27/32* (2006.01)

(52) U.S. Cl.
CPC ........ *G09G 3/2003* (2013.01); *H01L 27/3211* (2013.01); *G09G 2310/0264* (2013.01)

(58) Field of Classification Search
CPC .......... G09G 3/2003; G09G 2310/0264; H01L 27/3211
See application file for complete search history.

(56) References Cited

U.S. PATENT DOCUMENTS

| | | | |
|---|---|---|---|
| 2008/0198439 A1* | 8/2008 | Cho | G02F 1/091 359/280 |
| 2012/0162271 A1* | 6/2012 | Hsieh | H01L 27/3267 345/690 |

(Continued)

FOREIGN PATENT DOCUMENTS

| | | |
|---|---|---|
| CN | 104965338 A | 10/2015 |
| CN | 105870153 A | 8/2016 |

(Continued)

OTHER PUBLICATIONS

First Office Action for Chinese Application No. 201811399401.3, dated Mar. 31, 2020, 10 Pages.

*Primary Examiner* — Ryan A Lubit
(74) *Attorney, Agent, or Firm* — Brooks Kushman P.C.

(57) ABSTRACT

A display substrate, a display device and a display control method are provided. The display substrate comprises a plurality of pixel units. Each of the plurality of pixel units includes a first region and a second region which is switchable between a non-opaque status and an opaque status. The first region comprises a first light-emitting unit which is a single-sided light-emitting unit. The second region includes at least one color-variable component covering the second region. Each of the at least one color-variable component is switchable between a transparent status and a non-transparent status. The second region is in the non-opaque status in a condition that the at least one color-variable component is in a transparent status. The second region is in the opaque status in a condition that the at least one color-variable component is in a non-transparent status.

19 Claims, 3 Drawing Sheets

(56) References Cited

U.S. PATENT DOCUMENTS

| | | | |
|---|---|---|---|
| 2016/0254336 A1* | 9/2016 | Zhang | G02F 1/137 |
| | | | 349/33 |
| 2017/0170243 A1 | 6/2017 | An et al. | |
| 2017/0212398 A1 | 7/2017 | Cao et al. | |
| 2017/0310940 A1* | 10/2017 | Perdices-Gonzalez | ............... |
| | | | G09G 3/2096 |
| 2019/0348488 A1* | 11/2019 | Terai | H01L 27/322 |
| 2019/0393286 A1* | 12/2019 | Ding | H01L 27/3211 |

FOREIGN PATENT DOCUMENTS

| | | |
|---|---|---|
| CN | 106855676 A | 6/2017 |
| CN | 107017281 A | 8/2017 |

* cited by examiner

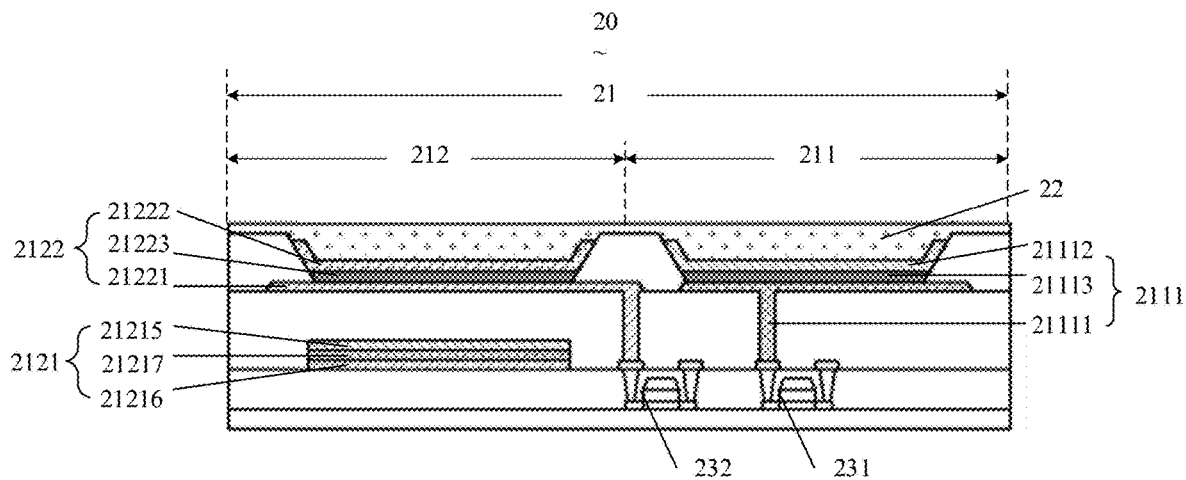
Fig. 7
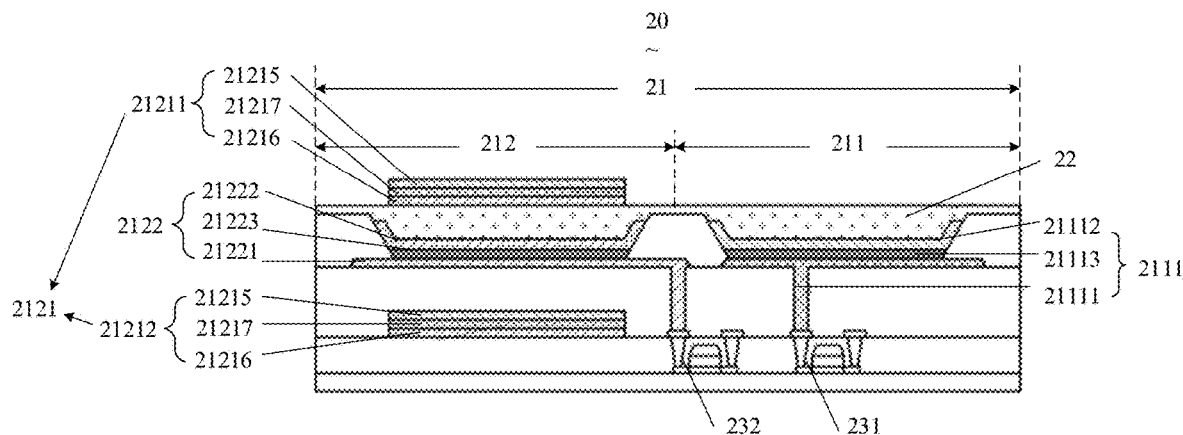
Fig. 8
controlling at least one variable color component to be in a transparent status or a non-transparent status according to a status to be displayed of the display device
Fig. 9

DISPLAY SUBSTRATE, DISPLAY DEVICE AND DISPLAY CONTROL METHOD

CROSS-REFERENCE TO RELATED APPLICATION

This application claims priority to Chinese Patent Application No. 201811399401.3 filed on Nov. 22, 2018, which is incorporated by reference herein in its entirety.

TECHNICAL FIELD

The present disclosure relates to the field of display technologies, in particular to a display substrate, a display device and a display control method.

BACKGROUND

A multi-function of a display device is one development trend in display industries. For example, a multi-functional display panel includes a display panel with a soundable screen, a display panel with a transparent display function and a display panel with a mirror display function.

SUMMARY

A display substrate includes a plurality of pixel units, where each of the plurality of pixel units comprises a first region and a second region which is switchable between a non-opaque status and an opaque status; the first region includes a first light-emitting unit which is a single-sided light-emitting unit; and the second region includes at least one color-variable component covering the second region, each of the at least one color-variable component is switchable between a transparent status and a non-transparent status; and the second region is in the opaque status in a condition that the at least one color-variable component is in a transparent status; the second region is in the non-opaque status in a condition that the at least one color-variable component is in a non-transparent status.

In some embodiments of the present disclosure, the second region includes at least two color-variable components.

In some embodiments of the present disclosure, the second region further includes a second light-emitting unit stacked with the at least one color-variable component, and the second light-emitting unit is a double-sided light-emitting unit.

In some embodiments of the present disclosure, the second region includes one color-variable component.

In some embodiments of the present disclosure, the display substrate further includes a driving thin film transistor, where the driving thin film transistor is connected to the first light-emitting unit and the second light-emitting unit.

In some embodiments of the present disclosure, the driving thin film transistor includes a first driving thin film transistor and a second driving thin film transistor, where the first driving thin film transistor is connected to the first light-emitting unit, and the second driving thin film transistor is connected to the second light-emitting unit.

In some embodiments of the present disclosure, the at least one color-variable component includes a first color-variable component and a second color-variable component, and the second light-emitting unit is disposed between the first color-variable component and the second color-variable component.

In some embodiments of the present disclosure, the display substrate further includes a driving thin film transistor, where the driving thin film transistor is connected to the first light-emitting unit and the second light-emitting unit.

In some embodiments of the present disclosure, the driving thin film transistor includes a first driving thin film transistor and a second driving thin film transistor, where the first driving thin film transistor is connected to the first light-emitting unit, and the second driving thin film transistor is connected to the second light-emitting unit.

In some embodiments of the present disclosure, each of the at least one color-variable component is an electrochromic component, and each of the at least one color-variable component includes a first transparent electrode, a second transparent electrode and an electrochromic layer arranged between the first transparent electrode and the second transparent electrode.

Some embodiments of the present disclosure provide a display device, including the above-mentioned display substrate.

Some embodiments of the present disclosure provide a display control method, applied to the above-mentioned display device, including:
controlling the at least one color-variable component to be in the transparent status or the non-transparent status based on a status to be displayed of the display device.

In some embodiments of the present disclosure, the controlling the at least one color-variable component to be in the transparent status or the non-transparent status based on a status to be displayed of the display device includes:
in a condition that the status to be displayed is a display status, controlling the first light-emitting unit to emit light and controlling at least one of the at least one color-variable component to be in the non-transparent status; and
in a condition that the status to be displayed is a non-display status, controlling the first light-emitting unit not to emit light and controlling the at least one color-variable component to be in the transparent status.

In some embodiments of the present disclosure, the second region further includes a second light-emitting unit which is a double-sided light-emitting unit; each of the plurality of pixel units includes a driving thin film transistor which is connected to the first light-emitting unit and the second light-emitting unit, the at least one color-variable component is stacked with the second light-emitting unit and is arranged at a first side of the second light-emitting unit, and the first side is a light-emitting side of the first light-emitting unit;
the controlling the at least one color-variable component to be in the transparent status or the non-transparent status based on a status to be displayed of the display device includes:
in a condition that the status to be displayed is a display status, controlling both the first light-emitting unit and the second light-emitting unit to emit light and controlling the at least one color-variable component to be in the transparent status or the non-transparent status; and
in a condition that the status to be displayed is a non-display status, controlling neither the first light-emitting unit nor the second light-emitting unit to emit light and controlling the at least one color-variable component to be in the transparent status.

In some embodiments of the present disclosure, the second region further includes a second light-emitting unit which is a double-sided light-emitting unit; each of the plurality of pixel units includes a first driving thin film transistor and a second driving thin film transistor, the first driving thin film transistor is connected to the first light-emitting unit, the second driving thin film transistor is connected to the second light-emitting unit, the at least one color-variable component is stacked with the second light-emitting unit and is arranged at a first side of the second light-emitting unit, and the first side is a light-emitting side of the first light-emitting unit, the controlling the at least one color-variable component to be in the transparent status or the non-transparent status based on a status to be displayed of the display device includes:

in a condition that the status to be displayed is a single-side display status, controlling the first light-emitting unit to emit light, controlling the second light-emitting unit not to emit light and controlling the at least one color-variable component to be in the non-transparent status;

in a condition that the status to be displayed is a first double-side display status, controlling both the first light-emitting unit and the second light-emitting unit to emit light, and controlling the at least one color-variable component to be in the non-transparent status;

in a condition that the status to be displayed is a second double-side display status, controlling both the first light-emitting unit and the second light-emitting unit to emit light, and controlling the at least one color-variable component to be in the transparent status; and in a condition that the status to be displayed is a non-display status, controlling neither the first light-emitting unit nor the second light-emitting unit to emit light, and controlling the at least one color-variable component to be in the transparent status.

In some embodiments of the present disclosure, the second region further includes a second light-emitting unit which is a double-sided light-emitting unit; each of the plurality of pixel units includes a driving thin film transistor which is connected to the first light-emitting unit and the second light-emitting unit, the at least one color-variable component is stacked with the second light-emitting unit and is arranged at a second side of the second light-emitting unit, and the second side is opposite to a light-emitting side of the first light-emitting unit, the controlling the at least one color-variable component to be in the transparent status or the non-transparent status based on a status to be displayed of the display device includes:

in a condition that the status to be displayed is a display status, controlling both the first light-emitting unit and the second light-emitting unit to emit light, and controlling the at least one color-variable component to be in the transparent status or the non-transparent status; and in a condition that the status to be displayed is a non-display status, controlling neither the first light-emitting unit nor the second light-emitting unit to emit light, and controlling the at least one color-variable component to be in the transparent status.

In some embodiments of the present disclosure, the second region further includes a second light-emitting unit which is a double-sided light-emitting unit; each of the plurality of pixel units includes a first driving thin film transistor and a second driving thin film transistor, the first driving thin film transistor is connected to the first light-emitting unit, the second driving thin film transistor is connected to the second light-emitting unit, the at least one color-variable component is stacked with the second light-emitting unit and is arranged at a second side of the second light-emitting unit, and the second side is opposite to a light-emitting side of the first light-emitting unit, the controlling the at least one color-variable component to be in the transparent status or the non-transparent status based on a status to be displayed of the display device includes:

in a condition that the status to be displayed is a single-side display status, controlling the first light-emitting unit to emit light, controlling the second light-emitting unit not to emit light and controlling the at least one color-variable component to be in the non-transparent status;

in a condition that the status to be displayed is a second single-side display status, controlling both the first light-emitting unit and the second light-emitting unit to emit light, and controlling the at least one color-variable component to be in the non-transparent status;

in a condition that the status to be displayed is a double-side display status, controlling both the first light-emitting unit and the second light-emitting unit to emit light, and controlling the at least one color-variable component to be in the transparent status; and in a condition that the status to be displayed is a non-display status, controlling neither the first light-emitting unit nor the second light-emitting unit to emit light, and controlling the at least one color-variable component to be in the transparent status.

In some embodiments of the present disclosure, the second region further includes a second light-emitting unit which is a double-sided light-emitting unit; each of the plurality of pixel units includes a driving thin film transistor which is connected to the first light-emitting unit and the second light-emitting unit, the at least one color-variable component comprises a first color-variable component and a second color-variable component, the second light-emitting unit is disposed between the first color-variable component and the second color-variable component, and the first color-variable component is arranged at a light-emitting side of the first light-emitting unit;

the controlling the at least one color-variable component to be in the transparent status or the non-transparent status based on a status to be displayed of the display device includes:

in a condition that the status to be displayed is a single-side display status, controlling both the first light-emitting unit and the second light-emitting unit to emit light, controlling the first color-variable component to be in the transparent status or the non-transparent status, and controlling the second color-variable component to be in the non-transparent status;

in a condition that the status to be displayed is a double-side display status, controlling both the first light-emitting unit and the second light-emitting unit to emit light, controlling the first color-variable component to be in the transparent status or the non-transparent status, and controlling the second color-variable component to be in the transparent status; and in a condition that the status to be displayed is a non-display status, controlling neither the first light-emitting unit nor the second light-emitting unit to emit light, and controlling both the first color-variable component and the second color-variable component to be in the transparent status.

In some embodiments of the present disclosure, the second region further includes a second light-emitting unit which is a double-sided light-emitting unit; each of the plurality of pixel units includes a first driving thin film transistor and a second driving thin film transistor, the first driving thin film transistor is connected to the first light-emitting unit, the second driving thin film transistor is connected to the second light-emitting unit, the at least one color-variable component comprises a first color-variable component and a second color-variable component, the second light-emitting unit is arranged between the first color-variable component and the second color-variable component, and the first color-variable component is arranged at a light-emitting side of the first light-emitting unit, the controlling the at least one color-variable component to be in the transparent status or the non-transparent status based on a status to be displayed of the display device includes:

in a condition that the status to be displayed is a first single-side display status, controlling the first light-emitting unit to emit light, controlling the second light-emitting unit not to emit light, controlling the first color-variable component to be in the transparent status or the non-transparent status, and controlling the second color-variable component to be in the non-transparent status;

in a condition that the status to be displayed is a second single-side display status, controlling both the first light-emitting unit and the second light-emitting unit to emit light, controlling the first color-variable component to be in the transparent status, and controlling the second color-variable component to be in the non-transparent status;

in a condition that the status to be displayed is a double-side display status, controlling both the first light-emitting unit and the second light-emitting unit to emit light, controlling the first color-variable component to be in the transparent status or the non-transparent status, and controlling the second color-variable component to be in the transparent status; and in a condition that the status to be displayed is a non-display status, controlling neither the first light-emitting unit nor the second light-emitting unit to emit light, and controlling both the first color-variable component and the second color-variable component to be in the transparent status.

BRIEF DESCRIPTION OF THE DRAWINGS

FIG. 7 is a schematic diagram of a display substrate according to some other embodiments of the present disclosure;

FIG. 8 is a schematic diagram of a display substrate according to some other embodiments of the present disclosure; and FIG. 9 is a flow chart of a display control method according to some embodiments of the present disclosure.

DETAILED DESCRIPTION

The technical solutions in the embodiments of the present disclosure will be clearly and completely described hereinafter in combination with the drawings. These embodiments described herein are merely parts of the embodiments of the present disclosure rather than all the embodiments. Based on the embodiments of the present disclosure, any other embodiments may be obtained by a person skilled in the art.

The display panel with a transparent display function is a product which has been developed successfully and kept transparent while displaying images.

During displaying, the transparent display device has poor transparent effects due to a low display contrast although it has a certain transparency.

Figure 1:
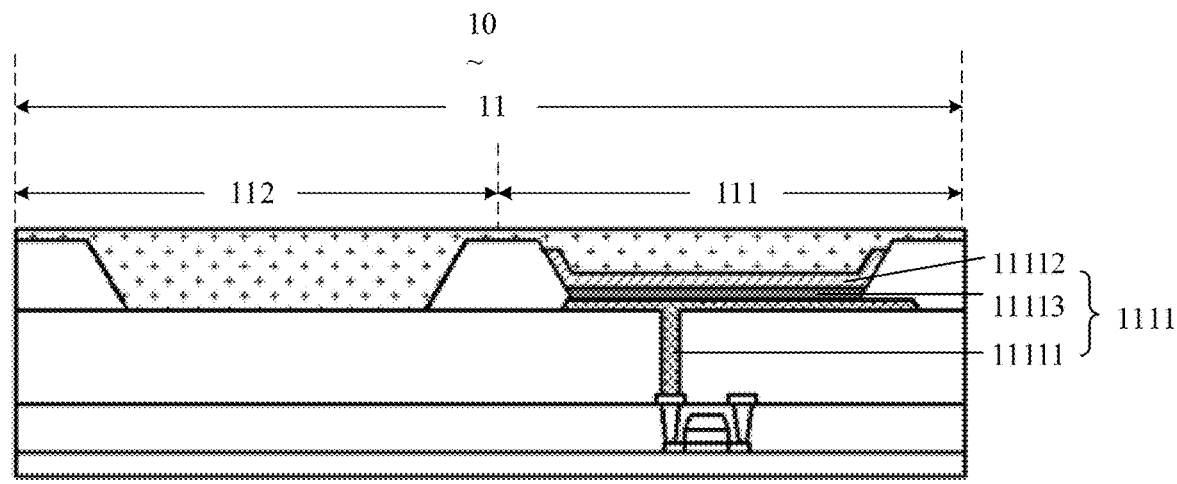
FIG. 1 is a schematic diagram of a display substrate in the related art.

FIG. 1 is a schematic diagram of a display substrate in the related art. This display substrate 10 includes a plurality of pixel units, and only one of the plurality of pixel units is shown in FIG. 1. The display unit 11 includes a first region 111 and a second region 112. The first region 111 includes a first light-emitting unit 1111 (including: a reflection anode 11111, a transparent cathode electrode 11112 and a light-emitting layer 11113), and the second region 112 is transparent. In the condition that the first light-emitting unit 1111 emits light, this display substrate 10 has a certain transparency, but a backlight of the second region 112 still travels through the second region 112, which reduces the display contrast, thereby affecting screen display.

Figure 2:
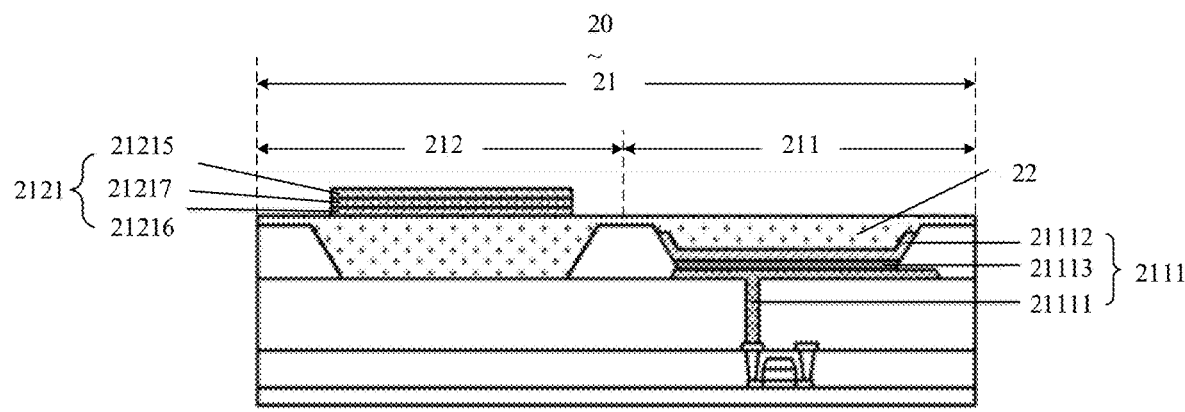
FIG. 2 is a schematic diagram of a display substrate according to some embodiments of the present disclosure.

FIG. 2 is a schematic diagram of a display substrate according to some embodiments of the present disclosure. The display substrate 20 includes a plurality of pixel units 21.

Each of the plurality of pixel units 21 includes a first region 211 and a second region 212, and the second region 212 is switchable between a non-opaque status and an opaque status.

The first region 211 includes a first light-emitting unit 2111 which is a single-sided light-emitting unit.

The second region 212 includes at least one color-variable component 2121 covering the second region 212, and the color-variable component 2121 is switchable between a transparent status and a non-transparent status.

The second region 212 is in the non-opaque status in a condition that the at least one color-variable component 2121 is in a transparent status. The second region is in the opaque status in a condition that the at least one color-variable component 2121 is in a non-transparent status.

The display substrate according to the above embodiments of the present disclosure may control the status of the color-variable component, increases a contrast of a display device including the display substrate, and improves display effect.

In some embodiments of the present disclosure, the light-emitting unit is an Organic Light-Emitting Diode (OLED).

In some other embodiments of the present disclosure, the light-emitting unit is other active light-emitting unit.

In some embodiments of the present disclosure, the first light-emitting unit 2111 is of a top emission structure, the first light-emitting unit 2111 includes a reflection anode 21111, a transparent cathode 21112 and a first light-emitting layer 21113 arranged between the reflection anode 21111 and the transparent cathode 21112.

In some other embodiments of the present disclosure, the first light-emitting unit 2111 is of a bottom emission structure, the first light-emitting unit 2111 includes a reflection cathode 21112, a transparent anode 21111 and a first light-emitting layer 21113 arranged between the reflection cathode 21112 and the transparent anode 21111.

In some embodiments of the present disclosure, the display substrate 20 further includes a packaging layer 22 which is configured to package the first light-emitting unit 2111.

In some embodiments of the present disclosure, one color-variable component is arranged in the second region, and the color-variable component is arranged at one side of the packaging layer, and the first side of the packaging layer is a light-emitting side of the first light-emitting unit.

Figure 3:
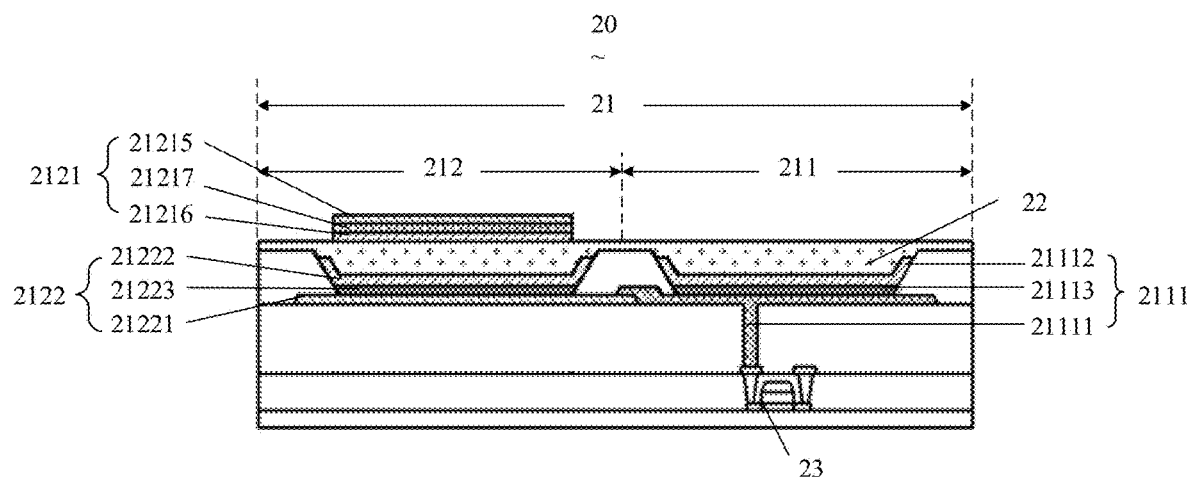
FIG. 3 is a schematic diagram of a display substrate according to some other embodiments of the present disclosure.
Figure 6:
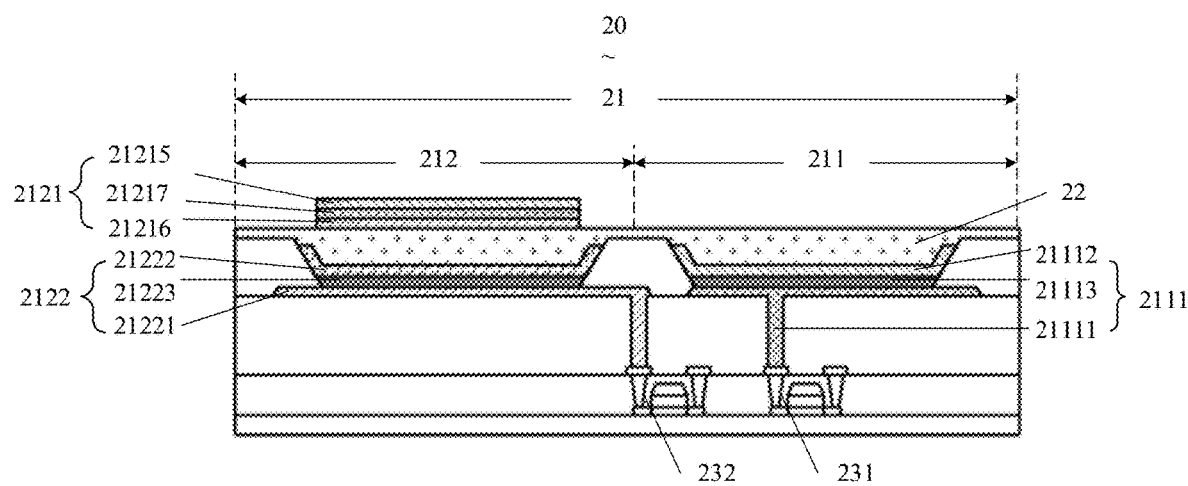
FIG. 6 is a schematic diagram of a display substrate according to some other embodiments of the present disclosure.

As shown in FIGS. 2, 3, and 6, the second region 212 includes one color-variable component 2121 which is arranged at a first side of the packaging layer 22, and the first side of the packaging layer is the light-emitting side of the first light-emitting unit 2111.

In some embodiments of the present disclosure, one color-variable component is arranged in the second region, and the color-variable component is arranged at a second side of the packaging layer, and the second side of the packaging layer is opposite to the light-emitting side of the first light-emitting unit.

Figure 4:
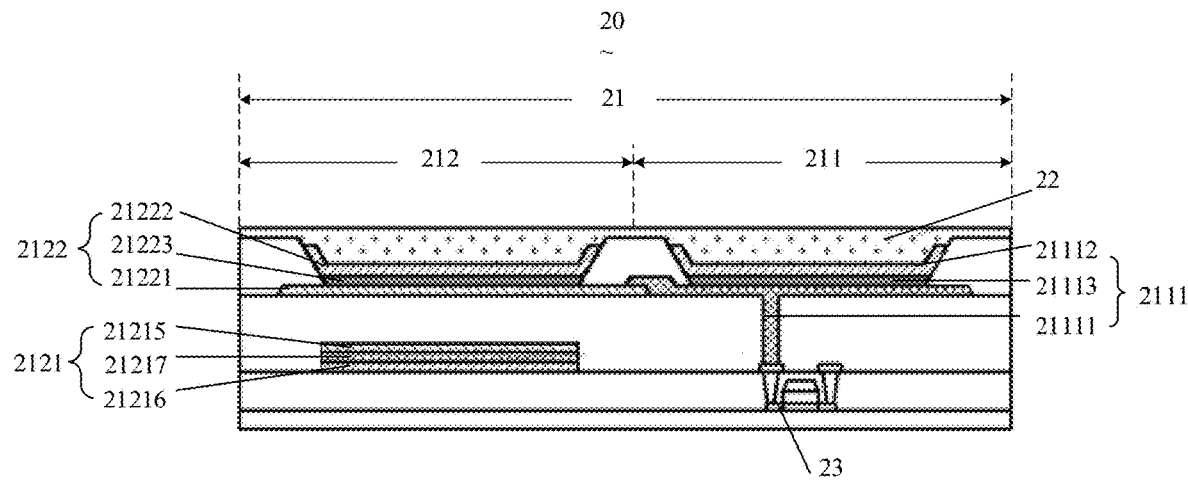
FIG. 4 is a schematic diagram of a display substrate according to some other embodiments of the present disclosure.

As shown in FIGS. 4 and 7, the second region includes one color-variable component 2121 which is arranged at a second side of the packaging layer 22, and the second side of the packaging layer is opposite to the light-emitting side of the first light-emitting unit 2111.

In some other embodiments of the present disclosure, two color-variable components are arranged in the second region at the first side and the second side of the packaging layer respectively.

Figure 5:
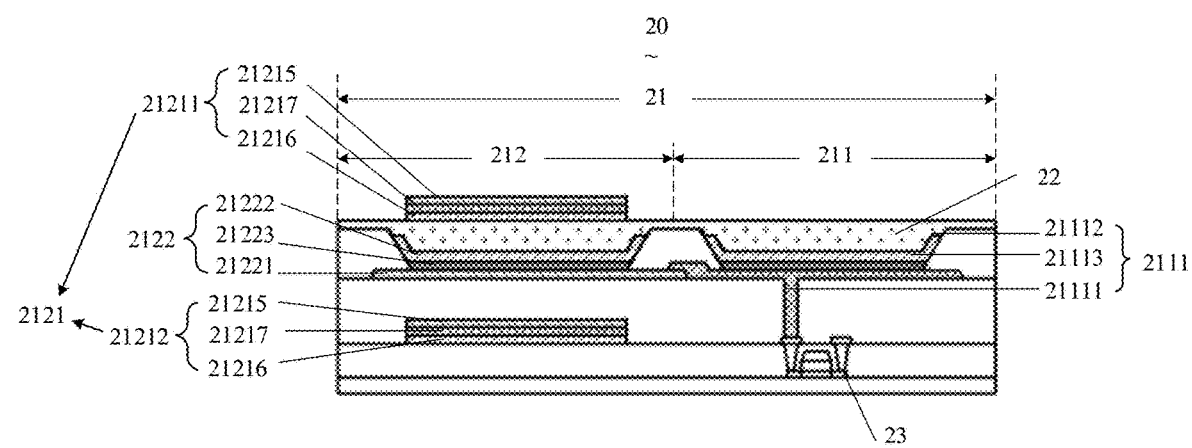
FIG. 5 is a schematic diagram of a display substrate according to some other embodiments of the present disclosure.

As shown in FIGS. 5 and 8, the second region 212 includes two color-variable components 2121 which are arranged at the first side and the second side of the packaging layer 22 respectively.

In some embodiments of the present disclosure, as shown in FIG. 2, no light-emitting unit is arranged in the second region 212.

In some other embodiments of the present disclosure, as shown in FIGS. 3-8, the second region 212 further includes a second light-emitting unit 2122 which is stacked with the color-variable component 2121 and is a double-sided light-emitting unit.

The second light-emitting unit 2122 is arranged in the second region 212, which improves diversity of display status of the display device including the display substrate.

FIGS. 3-5 are schematic diagrams of a display substrate according to some embodiments of the present disclosure. The color-variable component 2121 in FIG. 3 is arranged at a first side of the second light-emitting unit 2122, and the first side of the second light-emitting unit 2122 is the light-emitting side of the first light-emitting unit 2111.

The color-variable component 2121 in FIG. 4 is arranged at a second side of the second light-emitting unit 2122, and the second side of the second light-emitting unit 2122 is opposite to the light-emitting side of the first light-emitting unit 2111, the second side of the second light-emitting unit 2122 is a side of the second light-emitting unit 2122 away from the light-emitting side of the first light-emitting unit 2111.

The color-variable component 2121 in FIG. 5 includes a first color-variable component 21211 arranged at a first side of the second light-emitting unit 2122 and a second color-variable component 21212 arranged at a second side of the second light-emitting unit 2122, the first side of the second light-emitting unit 2122 is the light-emitting side of the first light-emitting unit 2111, and the second side of the second light-emitting unit 2122 is opposite to the light-emitting side of the first light-emitting unit 2111 (that is, a side away from the light-emitting side of the first light-emitting unit 2111).

In some embodiments of the present disclosure, as shown in FIGS. 3-8, the second light-emitting unit 2122 includes a transparent anode 21221, a transparent cathode 21222 and a second light-emitting layer 21223 arranged between the transparent anode 21221 and the transparent cathode 21222.

Since electrodes (the transparent anode 21221 and the transparent cathode 21222) of the second light-emitting unit 2122 are transparent, the second light-emitting layer 21223 is in a transparent status when not emitting light. Therefore the second region 212 is in an opaque status in a condition that the color-variable component 2121 is in a transparent status; and the second region 212 is in the non-opaque status in the condition that the color-variable component 2121 is in the non-transparent status.

In some embodiments of the present disclosure, at least one of the first light-emitting layer and the second light-emitting layers is a quantum dot light-emitting layer or an electroluminescence (EL) light-emitting layer.

In some embodiments of the present disclosure, the display substrate further includes a driving thin film transistor which is connected to the first light-emitting unit and the second light-emitting unit.

Taking FIGS. 3-5 as an example, a source of the driving thin film transistor 23 is connected to an anode 21111 of the first light-emitting unit 2111 and the anode 21221 of the second light-emitting unit 2122, so the driving thin film transistor 23 controls the first light-emitting unit 2111 and the second light-emitting unit 2122 at the same time.

In some other embodiments of the present disclosure, the display substrate further includes a driving thin film transistor which includes a first driving thin film transistor and a second driving thin film transistor, the first driving thin film transistor is connected to the first light-emitting unit, and the second driving thin film transistor is connected to the second light-emitting unit.

Taking FIGS. 6-8 as an example, the display substrate 20 includes a first driving thin film transistor 231 and a second driving thin film transistor 232. A source of the first driving thin film transistor 231 is connected to an anode 21111 of the first light-emitting unit 2111, and the first driving thin film transistor 231 is configured to control the first light-emitting unit 2111 to emit light or not to emit light. A source of the second driving thin film transistor 232 is connected to an anode 21221 of the second light-emitting unit 2121, and the second driving thin film transistor 232 is configured to control the second light-emitting unit 2122 to emit light or not to emit light.

In some embodiments of the present disclosure, each of the at least one color-variable component is an electrochromic component, each of the color-variable component 2121 includes a first transparent electrode, a second transparent electrode and an electrochromic layer arranged between the first transparent electrode and the second transparent electrode.

Still taking FIGS. 2-8 as an example, the color-variable component 2121 includes a first transparent electrode 21215, a second transparent electrode 21216 and an electrochromic layer 21217 arranged between the first transparent electrode 21215 and the second transparent electrode 21216. The electrodes (i.e., the first transparent electrode 21215 and the second transparent electrode 21216) of the color-variable component 2121 are transparent, and the electrochromic layer 21217 is switchable between the transparent status and the non-transparent status, thereby controlling the second region 212 to be switchable between the non-opaque status and the opaque status.

Some embodiments of the present disclosure provide a display device, including the display substrate according to any one of the above-mentioned embodiments.

Referring to FIG. 9, some embodiments of the present disclosure provide a display control method. FIG. 9 is a flow chart of a display control method according to some embodiments of the present disclosure. The display control method is applied to the display device according to any one of the above-mentioned embodiments.

The display control method includes step 91.

In the step 91, at least one color-variable component is controlled to be in a transparent status or a non-transparent status according to a status to be displayed of the display device.

The display control method according to the above embodiments of the present disclosure may control the status of the color-variable component, improve display effects and increase the contrast of the display device including the display substrate.

The display substrate in the display device according to some embodiments of the present disclosure is of various structures. The display control methods adopted by the display device with different display substrate structures are described below respectively.

In some embodiments of the present disclosure, the second region of the display substrate in the display device does not include a light-emitting unit and includes at least one color-variable component.

The controlling the at least one color-variable component to be in a transparent status or a non-transparent status according to a status to be displayed of the display device includes:

in a condition that the status to be displayed is a display status, controlling the first light-emitting unit to emit light and controlling at least one of the at least one color-variable component to be in the non-transparent status; and in a condition that the status to be displayed is a non-display status, controlling the first light-emitting unit not to emit light and controlling the at least one color-variable component to be in the transparent status.

Taking the display substrate in FIG. 2 as an example, in FIG. 2, the first side of the packaging layer 22 is provided with one color-variable component 2121, and the first side of the packaging layer 22 is the light-emitting side of the first light-emitting unit 2111.

In a condition that the status to be displayed is the display status, the color-variable component 2121 is controlled to be in a non-transparent status (for example, the electrochromic layer 21217 is controlled to be darkened), the first light-emitting unit 2111 emits light, and the color-variable component 2121 absorbs light rays reflected by the first light-emitting unit 2111 and external interfering light rays, thereby increasing the contrast of the display device and making the display effect better.

In a condition that the status to be displayed is the non-display status, the color-variable component 2121 is controlled to be in the transparent status, the first light-emitting unit 2111 is controlled not emit light, and the second region 212 is in the opaque status, improving the user experience.

In some other embodiments of the present disclosure, one color-variable component is arranged at a second side of the packaging layer, and the second side is opposite to the light-emitting side of the first light-emitting unit. In a condition that the status to be displayed is the display status, the first light-emitting unit is controlled to emit light, the color-variable component is in the non-transparent status, the color-variable component absorbs and blocks external interfering light rays (such as interfering light rays from one side of the color-variable component away from the light-emitting side of the first light-emitting unit). In a condition that the status to be displayed is the non-display status, the first light-emitting unit is controlled not to emit light, and the color-variable component is in the transparent status.

In some other embodiments of the present disclosure, the first side of the packaging layer is provided with one color-variable component, the second side of the packaging layer is provided with another color-variable component, the first side of the packaging layer is the light-emitting side of the first light-emitting unit, and the second side of the packaging layer is away from the light-emitting side of the first light-emitting unit. In a condition that the status to be displayed is the display status, the first light-emitting unit is controlled to emit light, at least one of the two color-variable components is in the non-transparent status. In a condition that the status to be displayed is the non-display status, the first light-emitting unit is controlled not to emit light, and the two color-variable components are both in the transparent status.

In some embodiments of the present disclosure, the second region of the display substrate in the display device further includes the second light-emitting unit which is a double-sided light-emitting unit.

The color-variable component is arranged at the first side of the second light-emitting unit, and the first side is the light-emitting side of the first light-emitting unit.

Each of the plurality of pixel units includes a driving thin film transistor which controls the first light-emitting unit and the second light-emitting unit at the same time, or separately, which are described below respectively.

In some embodiments of the present disclosure, the driving thin film transistor is connected to the first light-emitting unit and the second light-emitting unit, and controls the first light-emitting unit and the second light-emitting unit at the same time.

The controlling the at least one color-variable component to be in a transparent status or a non-transparent status according to a status to be displayed of the display device includes:

in a condition that the status to be displayed is a display status, controlling both the first light-emitting unit and the second light-emitting unit to emit light and controlling the at least one color-variable component to be in the transparent status or the non-transparent status; and in a condition that the status to be displayed is a non-display status, controlling neither the first light-emitting unit nor the second light-emitting unit to emit light and controlling the at least one color-variable component to be in the transparent status.

In some embodiments of the present disclosure, in the display substrate shown in FIG. 3, in a condition that the status to be displayed is the display status, both the first light-emitting unit 2111 and the second light-emitting unit 2122 are controlled to emit light, the color-variable component 2121 is controlled to be in the non-transparent status (for example, the electrochromic layer 21217 is controlled to be darkened), the first light-emitting unit 2111 emits light to the light-emitting side (upper side of the first light-emitting unit 2111 in FIG. 3) of the first light-emitting unit 2111, and the second light-emitting unit 2122 emits light to the light-emitting side of the first light-emitting unit 2111 and the side (that is, the lower side of the second light-emitting unit 2122) of the second light-emitting unit 2122 away from the light-emitting side of the first light-emitting unit 2111. Since the color-variable component 2121 is in the non-transparent status, the light rays emitted by the second light-emitting unit 2122 to the light-emitting side of the first light-emitting unit 2111 are absorbed and blocked by the color-variable component 2121. Therefore, contents displayed at the first side (light-emitting side of the first light-emitting unit 2111) of the display substrate 20 is displayed by the first light-emitting unit 2111, and the content displayed at the second side (the side opposite to the light-emitting side of the first light-emitting unit 2111) of the display substrate 20 is displayed by the second light-emitting unit 2122, and the display substrate implements double-sided display.

In some other embodiments of the present disclosure, in the display substrate shown in FIG. 3, in the display status, both the first light-emitting unit 2111 and the second light-emitting unit 2122 are controlled to emit light, the color-variable component 2121 is controlled to be in the transparent status, the content displayed at the first side (light-emitting side of the first light-emitting unit 2111) of the display substrate is displayed through the first light-emitting unit 2111 and the second light-emitting unit 2122, the content displayed at the second side (the side opposite to the light-emitting side of the first light-emitting unit 2111) of the display substrate is displayed through the second light-emitting unit 2122, and the display substrate implements double-sided display.

In the display substrate shown in FIG. 3, in a condition that the status to be displayed is a non-display status, neither the first light-emitting unit 2111 nor the second light-emitting unit 2122 are controlled to emit light, the color-variable component 2121 is controlled to be in the transparent status, and the display substrate shows a non-opaque status.

In some embodiments of the present disclosure, the pixel unit includes a driving thin film transistor which includes a first driving thin film transistor and a second driving thin film transistor, the first driving thin film transistor is connected to the first light-emitting unit, the second driving thin film transistor is connected to the second light-emitting unit, and the driving thin film transistor controls the first light-emitting unit and the second light-emitting unit separately.

The controlling the at least one color-variable component to be in a transparent status or a non-transparent status according to a status to be displayed of the display device includes:

in a condition that the status to be displayed is a single-side display status, controlling the first light-emitting unit to emit light, controlling the second light-emitting unit not to emit light and controlling the at least one color-variable component to be in the non-transparent status;

in a condition that the status to be displayed is a first double-sided display status, controlling both the first light-emitting unit and the second light-emitting unit to emit light, and controlling the at least one color-variable component to be in the non-transparent status;

in a condition that the status to be displayed is a second double-sided display status, controlling both the first light-emitting unit and the second light-emitting unit to emit light, and controlling the at least one color-variable component to be in the transparent status; and in a condition that the status to be displayed is a non-display status, controlling neither the first light-emitting unit nor the second light-emitting unit to emit light, and controlling the at least one color-variable component to be in the transparent status.

Taking the display substrate in FIG. 6 as an example, in the condition that the status to be displayed is a single-side display status, the first light-emitting unit 2111 is controlled to emit light, the second light-emitting unit 2122 does not emit light and the at least one color-variable component 2121 is controlled to be in the non-transparent status. At this point, the first region 211 is a bright region, the color-variable component 2121 absorbs light rays reflected by the first light-emitting unit 2111 and external light rays at the side of the second light-emitting unit 2122 away from the light-emitting side of the first light-emitting unit 211, i.e., the second region 212 is a dark region, which increases the contrast and makes the display effects better.

In the display substrate of FIG. 6, in a condition that the status to be displayed is a first double-sided display status, both the first light-emitting unit 2111 and the second light-emitting unit 2122 are controlled to emit light, and the color-variable component 2121 is controlled to be in the non-transparent status. At this point, the light rays emitted by the second light-emitting unit 2122 upwards are absorbed and blocked, contents displayed at the first side (light-emitting side of the first light-emitting unit 2111) of the display substrate is displayed through the first light-emitting unit 2111, and contents displayed at the second side (opposite to the light-emitting side of the first light-emitting unit 2111) of the display substrate is displayed through the second light-emitting unit 2122.

In the display substrate of FIG. 6, in the condition that the status to be displayed is a second double-sided display status, both the first light-emitting unit 2111 and the second light-emitting unit 2122 are controlled to emit light, and the color-variable component 2121 is controlled to be in the transparent status. At this point, contents displayed at the first side (light-emitting side of the first light-emitting unit 2111) of the display substrate is displayed by the first light-emitting unit 2111 and the second light-emitting unit 2122, and contents displayed at the second side (opposite to the light-emitting side of the first light-emitting unit 2111) of the display substrate is displayed by the second light-emitting unit 2122.

In the display substrate of FIG. 6, in the condition that the status to be displayed is a non-display status, neither the first light-emitting unit 2111 nor the second light-emitting unit 2122 are controlled to emit light, and the color-variable component 2121 is in the transparent status, thus the display substrate is in the non-opaque status.

In some embodiments of the present disclosure, the at least one color-variable component is arranged at the second side of the second light-emitting unit, and the second side is opposite to the light-emitting side of the first light-emitting unit.

Each of the plurality of pixel unit includes a driving thin film transistor which controls the first light-emitting unit and the second light-emitting unit at the same time or separately, which are described below respectively.

In some embodiments of the present disclosure, the driving thin film transistor is connected to the first light-emitting unit and the second light-emitting unit, and controls the first light-emitting unit and the second light-emitting unit at the same time.

The controlling the at least one color-variable component to be in a transparent status or a non-transparent status according to a status to be displayed of the display device includes:

in a condition that the status to be displayed is a display status, controlling both the first light-emitting unit and the second light-emitting unit to emit light and controlling the at least one color-variable component to be in the transparent status or the non-transparent status; and in a condition that the status to be displayed is a non-display status controlling neither the first light-emitting unit nor the second light-emitting unit to emit light, and controlling the at least one color-variable component to be in the transparent status.

In some embodiments of the present disclosure, taking the display substrate in FIG. 4 as an example, in the condition that the status to be displayed is the display status, both the first light-emitting unit 2111 and the second light-emitting unit 2122 are controlled to emit light, and the color-variable component 2121 is controlled to be in the transparent status. At this point, the display substrate realizes the double-side display, contents displayed at the first side (light-emitting side of the first light-emitting unit 2111) of the display substrate is displayed by the first light-emitting unit 2111 and the second light-emitting unit 2122, and contents displayed at the second side (opposite to the light-emitting side of the first light-emitting unit 2111) of the display substrate is displayed by the second light-emitting unit 2122.

In some embodiments of the present disclosure, in the display substrate shown in FIG. 4, in the condition that the status to be displayed is the display status, both the first light-emitting unit 2111 and the second light-emitting unit 2122 are controlled to emit light, and the color-variable component 2121 is controlled to be in the non-transparent status. At this point, light rays emitted by the second light-emitting unit 2122 downwards are absorbed and blocked by the color-variable component 2121 in the non-transparent status, the display substrate implements the single-side display, content displayed at the first side (light-emitting side of the first light-emitting unit 2111) of the display substrate is displayed by the first light-emitting unit 2111 and the second light-emitting unit 2122.

In the display substrate of FIG. 4, in the condition that the status to be displayed is a non-display status, neither the first light-emitting unit 2111 nor the second light-emitting unit 2122 are controlled to emit light, and the color-variable component 2121 is in the transparent status, thus the display substrate is in the opaque status.

In some embodiments of the present disclosure, each of the plurality of pixel units includes a driving thin film transistor which includes a first driving thin film transistor and a second driving thin film transistor, the first driving thin film transistor is connected to the first light-emitting unit, the second driving thin film transistor is connected to the second light-emitting unit, and the driving thin film transistor controls the first light-emitting unit and the second light-emitting unit.

The controlling the at least one color-variable component to be in a transparent status or a non-transparent status according to a status to be displayed of the display device includes:

in a condition that the status to be displayed is a first single-side display status, controlling the first light-emitting unit to emit light, the second light-emitting unit not to emit light and controlling the at least one color-variable component to be in the non-transparent status;

in a condition that the status to be displayed is a second single-side display status, controlling both the first light-emitting unit and the second light-emitting unit to emit light, and controlling the at least one color-variable component to be in the non-transparent status;

in a condition that the status to be displayed is a double-side display status, controlling both the first light-emitting unit and the second light-emitting unit to emit light, and controlling the at least one color-variable component to be in the transparent status; and in a condition that the status to be displayed is a non-display status, controlling neither the first light-emitting unit nor the second light-emitting unit to emit light, and controlling the at least one color-variable component to be in the transparent status.

Taking the display substrate in FIG. 7 as an example, in the condition that the status to be displayed is a first single-side display status, the first light-emitting unit 2111 is controlled to emit light, the second light-emitting unit 2122 is controlled not emit light and the color-variable component 2121 is controlled to be in the non-transparent status. The color-variable component 2121 absorbs and blocks external interfering light rays. At this point, the first region 211 is a bright region and the second region 212 is a dark region, which increases the contrast and makes the display effects better.

In the display substrate shown in FIG. 7, in the condition that the status to be displayed is a second single-side display status, both the first light-emitting unit 2111 and the second light-emitting unit 2122 are controlled to emit light, and the color-variable component 2121 is in the non-transparent status. At this point, the content displayed at the first side (light-emitting side of the first light-emitting unit 2111) of the display substrate is displayed by the first light-emitting unit 2111 and the second light-emitting unit 2122. Since light rays emitted by the second light-emitting unit 2122 towards the side away from the light-emitting side of the first light-emitting unit 2111 are absorbed and blocked by the color-variable component 2121, the second side (opposite to the light-emitting side of the first light-emitting unit 2111) of the display substrate does not display, and the display substrate implements the single-side display.

In the display substrate shown in FIG. 7, in the condition that the status to be displayed is a double-sided display status, both the first light-emitting unit 2111 and the second light-emitting unit 2122 are controlled to emit light, and the color-variable component 2121 is controlled to be in the transparent status. At this point, the display substrate implements the double-side display, the content displayed at the first side (light-emitting side of the first light-emitting unit 2111) of the display substrate is displayed by the first light-emitting unit 2111 and the second light-emitting unit 2122, and the content displayed at the second side (opposite to the light-emitting side of the first light-emitting unit 2111) of the display substrate is displayed by the second light-emitting unit 2122.

In the display substrate shown in FIG. 7, in the condition that the status to be displayed is a non-display status, neither the first light-emitting unit 2111 nor the second light-emitting unit 2122 are controlled to emit light, and the color-variable component 2121 is in the transparent status, thus the display substrate is in the opaque status.

In some embodiments of the present disclosure, the at least one color-variable component includes a first color-variable component and a second color-variable component, where the first color-variable component is arranged at the first side of the second light-emitting unit, the second color-variable component is arranged at the second side of the second light-emitting unit, the first side is the light-emitting side of the first light-emitting unit, and the second side is opposite to the light-emitting side of the first light-emitting unit.

Each of the plurality of pixel unit includes a driving thin film transistor which controls the first light-emitting unit and the second light-emitting unit at the same time or separately, which are described below respectively.

In some embodiments of the present disclosure, the driving thin film transistor is connected to the first light-emitting unit and the second light-emitting unit, and controls the first light-emitting unit and the second light-emitting unit at the same time.

The controlling the color-variable component to be in a transparent status or a non-transparent status according to a status to be displayed of the display device includes:
- in a condition that the status to be displayed is a single-side display status, controlling both the first light-emitting unit and the second light-emitting unit to emit light, controlling the first color-variable component to be in the transparent status or the non-transparent status, and controlling the second color-variable component to be in the non-transparent status;
- in a condition that the status to be displayed is a double-sided display status, controlling both the first light-emitting unit and the second light-emitting unit to emit light, controlling the first color-variable component to be in the transparent status or the non-transparent status, and controlling the second color-variable component to be in the transparent status; and
- in a condition that the status to be displayed is a non-display status, controlling neither the first light-emitting unit nor the second light-emitting unit to emit light, controlling the first color-variable component and the second color-variable component to be in the transparent status.

Taking the display substrate in FIG. 5 as an example, the first color-variable component 21211 is arranged at the first side of the second light-emitting unit 2122, and the second color-variable component 21212 is arranged at the second side of the second light-emitting unit 2122.

In some embodiments of the present disclosure, in the display substrate shown in FIG. 5, in the condition that the status to be displayed is a single-side display status, both the first light-emitting unit 2111 and the second light-emitting unit 2122 are controlled to emit light, the second color-variable component 21212 is controlled to be in the non-transparent status, and the first color-variable component 21211 is controlled to be in the transparent status. The content displayed at the first side (light-emitting side of the first light-emitting unit 2111) of the display substrate is displayed by the first light-emitting unit 2111 and the second light-emitting unit 2122. Since the second color-variable component 21212 is in the non-transparent status, light rays emitted by the second light-emitting unit 2122 downwards are blocked, and the second side (opposite to the light-emitting side of the first light-emitting unit 2111) of the display substrate does not display.

In some other embodiments of the present disclosure, in the display substrate shown in FIG. 5, in the condition that the status to be displayed is the single-side display status, both the first light-emitting unit 2111 and the second light-emitting unit 2122 are controlled to emit light, the second color-variable component 21212 is in the non-transparent status, and the first color-variable component 21211 is controlled to be in the non-transparent status. Although the second light-emitting unit 2122 emits light, the emitted light rays are absorbed and blocked by the first color-variable component 21211 and the second color-variable component 21212, the content displayed at the first side (light-emitting side of the first light-emitting unit 2111) of the display substrate is displayed by the first light-emitting unit 2111 and the second side (opposite to the light-emitting side of the first light-emitting unit 2111) of the display substrate does not display.

In some embodiments of the present disclosure, in the display substrate shown in FIG. 5, in the condition that the status to be displayed is a double-side display status, both the first light-emitting unit 2111 and the second light-emitting unit 2122 are controlled to emit light, the second color-variable component 21212 is in the transparent status, and the first color-variable component 21211 is controlled to be in the transparent status. The content displayed at the first side (light-emitting side of the first light-emitting unit 2111) of the display substrate is displayed by the first light-emitting unit 2111 and the second light-emitting unit 2122, and the content displayed at the second side (opposite to the light-emitting side of the first light-emitting unit 2111) of the display substrate is displayed by the second light-emitting unit 2122.

In some embodiments of the present disclosure, in the display substrate shown in FIG. 5, in the condition that the status to be displayed is a double-side display status, the first color-variable component 21211 is controlled to be in the non-transparent status, and the second color-variable component 21212 is controlled to be in the transparent status. The content displayed at the first side (light-emitting side of the first light-emitting unit 2111) of the display substrate is displayed by the first light-emitting unit 2111, and the content displayed at the second side (opposite to the light-emitting side of the first light-emitting unit 2111) of the display substrate is displayed by the second light-emitting unit 2122.

In some embodiments of the present disclosure, the driving thin film transistor includes a first driving thin film transistor and a second driving thin film transistor, where the first driving thin film transistor is connected to the first light-emitting unit, the second driving thin film transistor is connected to the second light-emitting unit, and the driving thin film transistor controls the first light-emitting unit and the second light-emitting unit separately.

The controlling the at least one color-variable component to be in a transparent status or a non-transparent status according to a status to be displayed of the display device includes:
- in the condition that the status to be displayed is a first single-side display status, controlling the first light-emitting unit to emit light, controlling the second light-emitting unit not to emit light, controlling the first color-variable component to be in the transparent or non-transparent status, and controlling the second color-variable component in the non-transparent status;
- in the condition that the status to be displayed is a second single-side display status, controlling both the first light-emitting unit and the second light-emitting unit to emit light, controlling the first color-variable component to be in the transparent status, and controlling the second color-variable component in the non-transparent status;

in a condition that the status to be displayed is a double-side display status, controlling both the first light-emitting unit and the second light-emitting unit to emit light, controlling the first color-variable component to be in the transparent status or the non-transparent status, controlling the second color-variable component to be in the transparent status; and in a condition that the status to be displayed is a non-display status, controlling neither the first light-emitting unit nor the second light-emitting unit to emit light, and controlling both the first color-variable component and the second color-variable component to be in the transparent status.

In some embodiments of the present disclosure, taking the display substrate in FIG. 8 as an example, in the condition that the status to be displayed is the first single-side display status, the first light-emitting unit 2111 is controlled to emit light, the second light-emitting unit 2122 is controlled not emit light, the second color-variable component 21212 is controlled to be in the non-transparent status, and the first color-variable component 21211 is controlled to be in the transparent status. At this point, external interfering light rays are absorbed by the second color-variable component 21212, and the second light-emitting unit 2122 does not emit light. The second region 212 is a dark region, and the first region 211 is a bright region, which increases the contrast of the display device.

In some other embodiments of the present disclosure, taking the display substrate in FIG. 8 as an example, in the condition that the status to be displayed is a first single-side display status, the first light-emitting unit 2111 is controlled to emit light, the second light-emitting unit 2122 is controlled not emit light, the first color-variable component 21211 is controlled to be in the non-transparent status, and at this point the first color-variable component 21211 absorbs and blocks light rays reflected by the first light-emitting unit 2111, thereby increasing the contrast of the display device.

In some embodiments of the present disclosure, in the display substrate shown in FIG. 8, in the condition that the status to be displayed is the second single-side display status, both the first light-emitting unit 2111 and the second light-emitting unit 2122 are controlled to emit light, the second color-variable component 21212 is controlled to be in the non-transparent status, and the first color-variable component 21211 is controlled to be in the transparent status. At this point, light rays emitted by the second light-emitting unit 2122 downwards are blocked by the second color-variable component 21212. Therefore, the content displayed at the first side (light-emitting side of the first light-emitting unit 2111) of the display substrate is displayed by the first light-emitting unit 2111 and the second light-emitting unit 2122, and the second side (opposite to the light-emitting side of the first light-emitting unit 2111) of the display substrate does not display.

In some other embodiments of the present disclosure, taking the display substrate in FIG. 8 as an example, in the condition that the status to be displayed is the second single-side display status, both the first light-emitting unit 2111 and the second light-emitting unit 2122 are controlled to emit light, and the first color-variable component 21211 is in the non-transparent status. At this point, light rays emitted by the second light-emitting unit 2122 are blocked by the first color-variable component 21211 and the second color-variable component 21212. Therefore, the content displayed at the first side (light-emitting side of the first light-emitting unit 2111) of the display substrate is displayed by the first light-emitting unit 2111, and the second side (opposite to the light-emitting side of the first light-emitting unit 2111) of the display substrate does not display.

In some embodiments of the present disclosure, taking the display substrate in FIG. 8 as an example, in the condition that the status to be displayed is a double-side display status, both the first light-emitting unit 2111 and the second light-emitting unit 2122 are controlled to emit light, the second color-variable component 21212 is in the transparent status, the first color-variable component 21211 is in the transparent status. The content displayed at the first side (light-emitting side of the first light-emitting unit 2111) of the display substrate is displayed by the first light-emitting unit 2111 and the second light-emitting unit 2122, and the content displayed at the second side (opposite to the light-emitting side of the first light-emitting unit 2111) of the display substrate is displayed by the second light-emitting unit 2122.

In some embodiments of the present disclosure, taking the display substrate in FIG. 8 as an example, in the condition that the status to be displayed is a double-side display status, both the first light-emitting unit 2111 and the second light-emitting unit 2122 are controlled to emit light, and the first color-variable component 21211 is controlled to be in the non-transparent status. The content displayed at the first side (light-emitting side of the first light-emitting unit 2111) of the display substrate is displayed by the first light-emitting unit 2111 and the second light-emitting unit 2122, and the content displayed at the second side (opposite to the light-emitting side of the first light-emitting unit 2111) of the display substrate is displayed by the second light-emitting unit 2122.

Taking the display substrate in FIG. 8 as an example, in the condition that the status to be displayed is a non-display status, neither the first light-emitting unit 2111 nor the second light-emitting unit 2122 are controlled to emit light, and the first color-variable component 21211 and the second color-variable component 21212 are in the transparent status, thus the display substrate is in the opaque status.

In some embodiments of the present disclosure, the content displayed at the first side (light-emitting side of the first light-emitting unit 2111) of the display substrate is displayed by the first light-emitting unit 2111 and the second light-emitting unit 2122. For example, the first light-emitting unit 2111 and the second light-emitting unit 2122 display one character together, and a font of the character is bolder than that of a character displayed by the first light-emitting unit 2111 separately.

In some embodiments of the present disclosure, the display substrate implements the double-sided display, and the content displayed at the first side (light-emitting side of the first light-emitting unit 2111) of the display substrate is displayed by the first light-emitting unit 2111 and the second light-emitting unit 2122 together. The content displayed at the second side (opposite to the light-emitting side of the first light-emitting unit 2111) of the display substrate is displayed by the second light-emitting unit 2122, and the first light-emitting unit 2111 and the second light-emitting unit 2122 display the same content which is overlapped at the first side of the display substrate. The font of a displayed character (for example, character B) is bolder than that of a character displayed by the first light-emitting unit 2111 separately. At the second side of the display substrate, the second light-emitting unit 2122 normally displays a reversed B, i.e., 田. That is, content displayed at the first side of the display substrate and content displayed at the second side of the display substrate are the same, which display in a reversed direction.

In some embodiments of the present disclosure, the first driving thin film transistor is configured to control the first light-emitting unit, the second driving thin film transistor controls the second light-emitting unit, the color-variable component arranged at the first side of the second light-emitting unit 2122 is controlled to be in the non-transparent status, the color-variable component arranged at the second side of the second light-emitting unit 2122 is in the transparent status (the second side of the second light-emitting unit 2122 is provided with the color-variable component), the first light-emitting unit 2111 is controlled to display a first preset information at the first side of the display substrate, and the second light-emitting unit 2122 displays a second preset information at the second side of the display substrate.

In some embodiments of the present disclosure, the first preset information is the same as the second preset information.

Taking FIGS. 6 and 8 as an example, the content displayed at the first side (light-emitting side of the first light-emitting unit 2111) of the display substrate is controlled to be displayed only by the first light-emitting unit 2111, the content displayed at the second side (opposite to the light-emitting side of the first light-emitting unit 2111) of the display substrate is displayed only by the second light-emitting unit 2122, and the first side and the second side of the display substrate display a same content.

For example, the first side and second side of the display substrate display a same character B, the first driving thin film transistor 231 outputs a first control signal, the first light-emitting unit 2111 displays B at the first side of the display substrate according to this first control signal; and the second driving thin film transistor 232 outputs a second control signal, and the second light-emitting unit 2122 displays B at the second side of the display substrate according to the second control signal.

In a condition that a color-variable component (e.g., color-variable component 2121 in FIG. 6, first color-variable component 21211 in FIG. 8) arranged at the first side of the second light-emitting unit 2122 is in the transparent status, light rays emitted upwards by the second light-emitting unit 2122 display a reversed B at the first side of the display substrate, which interferes display at the first side of the display substrate. However, a color-variable component (e.g., the color-variable component 2121 in FIG. 6, the first color-variable component 21211 in FIG. 8) arranged at the first side of the second light-emitting unit 2122 is in the non-transparent status. Therefore, the content displayed at the first side (light-emitting side of the first light-emitting unit 2111) of the display substrate is only displayed by the first light-emitting unit 2111. That is, the B displayed by the first light-emitting unit 2111 at the first side of the display substrate has a standard font, without reversing.

The content displayed at the second side (opposite to the light-emitting side of the first light-emitting unit 2111) of the display substrate is only displayed by the second light-emitting unit 2122. That is, the B displayed by the second light-emitting unit 2122 at the second side of the display substrate has a standard font, without reversing.

Therefore, the first side and the second side of the display substrate may display the B with a standard font, without reversing, and the second light-emitting unit 2122 does not influence the contents displayed at the first side of the display substrate (for example, the font of B displayed at the first side of the display substrate becomes bold).

In some embodiments of the present disclosure, the first preset information is different from the second preset information.

That is, the content displayed at the first side of the display substrate by the first light-emitting unit 2111 is different from that displayed at the second side of the display substrate by the second light-emitting unit 2122.

In the above embodiments of the present disclosure, the user selects the status to be displayed of the display device with respect to different display devices, thereby switching the display status of the display device. The diverse display meets different demands of users.

The above descriptions are merely some embodiments of the present disclosure. It should be pointed out that several improvements and modifications may be made for a person skilled in the art without departing from the principle of the present disclosure.

What is claimed is:

1. A display substrate, comprising:
   a plurality of pixel units,
   wherein each of the plurality of pixel units comprises a first region and a second region which is switchable between a non-opaque status and an opaque status;
   the first region comprises a first light-emitting unit which is a single-sided light-emitting unit;
   the second region comprises at least one color-variable component covering the second region, each of the at least one color-variable component is switchable between a transparent status and a non-transparent status; and
   the second region is in the opaque status in a condition that the at least one color-variable component is in a transparent status; the second region is in the non-opaque status in a condition that the at least one color-variable component is in a non-transparent status.

2. The display substrate according to claim 1, wherein the second region comprises at least two color-variable components.

3. The display substrate according to claim 1, wherein the second region further comprises a second light-emitting unit stacked with the at least one color-variable component, and the second light-emitting unit is a double-sided light-emitting unit.

4. The display substrate according to claim 3, wherein the second region comprises one color-variable component.

5. The display substrate according to claim 4, further comprising: a driving thin film transistor,
   wherein the driving thin film transistor is connected to the first light-emitting unit and the second light-emitting unit.

6. The display substrate according to claim 5, wherein the driving thin film transistor comprises a first driving thin film transistor and a second driving thin film transistor, wherein the first driving thin film transistor is connected to the first light-emitting unit, and the second driving thin film transistor is connected to the second light-emitting unit.

7. The display substrate according to claim 3, wherein the at least one color-variable component comprises a first color-variable component and a second color-variable component, and the second light-emitting unit is disposed between the first color-variable component and the second color-variable component.

8. The display substrate according to claim 7, further comprising: a driving thin film transistor, wherein the driving thin film transistor is connected to the first light-emitting unit and the second light-emitting unit.

9. The display substrate according to claim 8, wherein the driving thin film transistor comprises a first driving thin film transistor and a second driving thin film transistor, wherein the first driving thin film transistor is connected to the first light-emitting unit, and the second driving thin film transistor is connected to the second light-emitting unit.

10. The display substrate according to claim 1, wherein each of the at least one color-variable component is an electrochromic component, and each of the at least one color-variable component comprises a first transparent electrode, a second transparent electrode and an electrochromic layer arranged between the first transparent electrode and the second transparent electrode.

11. A display device, comprising the display substrate according to claim 1.

12. A display control method, applied to a display device having a display substrate, the display substrate including a plurality of pixel units, wherein each of the plurality of pixel units includes a first region and a second region which is switchable between a non-opaque status and an opaque status; the first region includes a first light-emitting unit which is a single-sided light-emitting unit the second region includes at least one color-variable component covering the second region, each of the at least one color-variable component is switchable between a transparent status and a non-transparent status; and the second region is in the opaque status in a condition that the at least one color-variable component is in a transparent status; the second region is in the non-opaque status in a condition that the at least one color-variable component is in a non-transparent status, wherein the method comprises:
controlling the at least one color-variable component to be in the transparent status or the non-transparent status based on a status to be displayed of the display device.

13. The display control method according to claim 12, wherein
the controlling the at least one color-variable component to be in the transparent status or the non-transparent status based on a status to be displayed of the display device comprises:
in a condition that the status to be displayed is a display status, controlling the first light-emitting unit to emit light and controlling at least one of the at least one color-variable component to be in the non-transparent status; and
in a condition that the status to be displayed is a non-display status, controlling the first light-emitting unit not to emit light and controlling the at least one color-variable component to be in the transparent status.

14. The display control method according to claim 12, wherein
the second region further comprises a second light-emitting unit which is a double-sided light-emitting unit; each of the plurality of pixel units comprises a driving thin film transistor which is connected to the first light-emitting unit and the second light-emitting unit, the at least one color-variable component is stacked with the second light-emitting unit and is arranged at a first side of the second light-emitting unit, and the first side is a light-emitting side of the first light-emitting unit;

the controlling the at least one color-variable component to be in the transparent status or the non-transparent status based on a status to be displayed of the display device comprises:
in a condition that the status to be displayed is a display status, controlling both the first light-emitting unit and the second light-emitting unit to emit light and controlling the at least one color-variable component to be in the transparent status or the non-transparent status; and
in a condition that the status to be displayed is a non-display status, controlling neither the first light-emitting unit nor the second light-emitting unit to emit light and controlling the at least one color-variable component to be in the transparent status.

15. The display control method according to claim 12, wherein
the second region further comprises a second light-emitting unit which is a double-sided light-emitting unit; each of the plurality of pixel units comprises a first driving thin film transistor and a second driving thin film transistor, the first driving thin film transistor is connected to the first light-emitting unit, the second driving thin film transistor is connected to the second light-emitting unit, the at least one color-variable component is stacked with the second light-emitting unit and is arranged at a first side of the second light-emitting unit, and the first side is a light-emitting side of the first light-emitting unit;

the controlling the at least one color-variable component to be in the transparent status or the non-transparent status based on a status to be displayed of the display device comprises:
in a condition that the status to be displayed is a single-side display status, controlling the first light-emitting unit to emit light, controlling the second light-emitting unit not to emit light and controlling the at least one color-variable component to be in the non-transparent status;
in a condition that the status to be displayed is a first double-side display status, controlling both the first light-emitting unit and the second light-emitting unit to emit light, and controlling the at least one color-variable component to be in the non-transparent status;
in a condition that the status to be displayed is a second double-side display status, controlling both the first light-emitting unit and the second light-emitting unit to emit light, and controlling the at least one color-variable component to be in the transparent status; and
in a condition that the status to be displayed is a non-display status, controlling neither the first light-emitting unit nor the second light-emitting unit to emit light, and controlling the at least one color-variable component to be in the transparent status.

16. The display control method according to claim 12, wherein
the second region further comprises a second light-emitting unit which is a double-sided light-emitting unit; each of the plurality of pixel units comprises a driving thin film transistor which is connected to the first light-emitting unit and the second light-emitting unit, the at least one color-variable component is stacked with the second light-emitting unit and is arranged at a second side of the second light-emitting unit, and the second side is opposite to a light-emitting side of the first light-emitting unit;

the controlling the at least one color-variable component to be in the transparent status or the non-transparent status based on a status to be displayed of the display device comprises:

in a condition that the status to be displayed is a display status, controlling both the first light-emitting unit and the second light-emitting unit to emit light, and controlling the at least one color-variable component to be in the transparent status or the non-transparent status; and in a condition that the status to be displayed is a non-display status, controlling neither the first light-emitting unit nor the second light-emitting unit to emit light, and controlling the at least one color-variable component to be in the transparent status.

17. The display control method according to claim 12, wherein the second region further comprises a second light-emitting unit which is a double-sided light-emitting unit; each of the plurality of pixel units comprises a first driving thin film transistor and a second driving thin film transistor, the first driving thin film transistor is connected to the first light-emitting unit, the second driving thin film transistor is connected to the second light-emitting unit, the at least one color-variable component is stacked with the second light-emitting unit and is arranged at a second side of the second light-emitting unit, and the second side is opposite to a light-emitting side of the first light-emitting unit;

the controlling the at least one color-variable component to be in the transparent status or the non-transparent status based on a status to be displayed of the display device comprises:

in a condition that the status to be displayed is a single-side display status, controlling the first light-emitting unit to emit light, controlling the second light-emitting unit not to emit light and controlling the at least one color-variable component to be in the non-transparent status;

in a condition that the status to be displayed is a second single-side display status, controlling both the first light-emitting unit and the second light-emitting unit to emit light, and controlling the at least one color-variable component to be in the non-transparent status;

in a condition that the status to be displayed is a double-side display status, controlling both the first light-emitting unit and the second light-emitting unit to emit light, and controlling the at least one color-variable component to be in the transparent status; and in a condition that the status to be displayed is a non-display status, controlling neither the first light-emitting unit nor the second light-emitting unit to emit light, and controlling the at least one color-variable component to be in the transparent status.

18. The display control method according to claim 12, wherein the second region further comprises a second light-emitting unit which is a double-sided light-emitting unit; each of the plurality of pixel units comprises a driving thin film transistor which is connected to the first light-emitting unit and the second light-emitting unit, the at least one color-variable component comprises a first color-variable component and a second color-variable component, the second light-emitting unit is disposed between the first color-variable component and the second color-variable component, and the first color-variable component is arranged at a light-emitting side of the first light-emitting unit;

the controlling the at least one color-variable component to be in the transparent status or the non-transparent status based on a status to be displayed of the display device comprises:

in a condition that the status to be displayed is a single-side display status, controlling both the first light-emitting unit and the second light-emitting unit to emit light, controlling the first color-variable component to be in the transparent status or the non-transparent status, and controlling the second color-variable component to be in the non-transparent status;

in a condition that the status to be displayed is a double-side display status, controlling both the first light-emitting unit and the second light-emitting unit to emit light, controlling the first color-variable component to be in the transparent status or the non-transparent status, and controlling the second color-variable component to be in the transparent status; and in a condition that the status to be displayed is a non-display status, controlling neither the first light-emitting unit nor the second light-emitting unit to emit light, and controlling both the first color-variable component and the second color-variable component to be in the transparent status.

19. The display control method according to claim 12, wherein the second region further comprises a second light-emitting unit which is a double-sided light-emitting unit; each of the plurality of pixel units comprises a first driving thin film transistor and a second driving thin film transistor, the first driving thin film transistor is connected to the first light-emitting unit, the second driving thin film transistor is connected to the second light-emitting unit, the at least one color-variable component comprises a first color-variable component and a second color-variable component, the second light-emitting unit is arranged between the first color-variable component and the second color-variable component, and the first color-variable component is arranged at a light-emitting side of the first light-emitting unit;

the controlling the at least one color-variable component to be in the transparent status or the non-transparent status based on a status to be displayed of the display device comprises:

in a condition that the status to be displayed is a first single-side display status, controlling the first light-emitting unit to emit light, controlling the second light-emitting unit not to emit light, controlling the first color-variable component to be in the transparent status or the non-transparent status, and controlling the second color-variable component to be in the non-transparent status;

in a condition that the status to be displayed is a second single-side display status, controlling both the first light-emitting unit and the second light-emitting unit to emit light, controlling the first color-variable component to be in the transparent status, and controlling the second color-variable component to be in the non-transparent status;

in a condition that the status to be displayed is a double-side display status, controlling both the first light-emitting unit and the second light-emitting unit to emit light, controlling the first color-variable component to be in the transparent status or the non-transparent status, and controlling the second color-variable component to be in the transparent status; and in a condition that the status to be displayed is a non-display status, controlling neither the first light-emitting unit nor the second light-emitting unit to emit light, and controlling both the first color-variable component and the second color-variable component to be in the transparent status.

* * * * *